(12) United States Patent
Brask et al.

(10) Patent No.: US 7,220,635 B2
(45) Date of Patent: May 22, 2007

(54) METHOD FOR MAKING A SEMICONDUCTOR DEVICE WITH A METAL GATE ELECTRODE THAT IS FORMED ON AN ANNEALED HIGH-K GATE DIELECTRIC LAYER

(75) Inventors: Justin K. Brask, Portland, OR (US); Mark L. Doczy, Beaverton, OR (US); Jack Kavalieros, Portland, OR (US); Uday Shah, Portland, OR (US); Matthew V. Metz, Hillsboro, OR (US); Chris E. Barns, Portland, OR (US); Suman Datta, Beaverton, OR (US); Christopher D. Thomas, Aloha, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 563 days.

(21) Appl. No.: 10/742,678

(22) Filed: Dec. 19, 2003

(65) Prior Publication Data

US 2006/0183277 A1    Aug. 17, 2006

(51) Int. Cl.
 *H01L 21/8238* (2006.01)
(52) U.S. Cl. ............... 438/216; 438/231; 257/E21.639
(58) Field of Classification Search ............... 438/216, 438/231, 591, 785; 257/E21.639
See application file for complete search history.

(56) References Cited

U.S. PATENT DOCUMENTS 6,033,963 A * 3/2000 Huang et al. ............... 438/303
6,063,698 A   5/2000 Tseng et al. ............... 438/585
6,184,072 B1  2/2001 Kaushik et al. ............ 438/197
6,255,698 B1  7/2001 Gardner et al. ............ 257/369
6,300,201 B1* 10/2001 Shao et al. ............... 438/281
6,365,450 B1  4/2002 Kim ......................... 438/216
6,410,376 B1  6/2002 Ng et al. ................... 438/199
6,420,279 B1  7/2002 Ono et al. .................. 438/785
6,475,874 B2  11/2002 Xiang et al. ............... 438/396
6,514,828 B2  2/2003 Ahn et al. .................. 438/240

(Continued)

FOREIGN PATENT DOCUMENTS

EP    0 899 784 AZ    3/1999

(Continued)

OTHER PUBLICATIONS

Brask et al., "A Method for Making a Semiconductor Device that Includes a Metal Gate Electrode", U.S. Appl. No. 10/739,173, filed Dec. 18, 2003.

(Continued)

*Primary Examiner*—Chandra Chaudhari
(74) *Attorney, Agent, or Firm*—Rahul D. Engineer

(57) ABSTRACT

A method for making a semiconductor device is described. That method comprises forming a high-k gate dielectric layer on a substrate, and forming a sacrificial layer on the high-k gate dielectric layer. After etching the sacrificial layer, first and second spacers are formed on opposite sides of the sacrificial layer. After removing the sacrificial layer to generate a trench that is positioned between the first and second spacers, a metal layer is formed on the high-k gate dielectric layer.

20 Claims, 4 Drawing Sheets

U.S. PATENT DOCUMENTS

| | | | | |
|---|---|---|---|---|
| 6,544,906 | B2 | 4/2003 | Rotondaro et al. | 438/785 |
| 6,586,288 | B2 | 7/2003 | Kim et al. | 438/183 |
| 6,617,209 | B1 | 9/2003 | Chau et al. | 438/240 |
| 6,617,210 | B1 | 9/2003 | Chau et al. | 438/240 |
| 6,642,131 | B2 | 11/2003 | Harada | 438/591 |
| 6,667,246 | B2 | 12/2003 | Mitsuhashi et al. | 438/756 |
| 2002/0058374 | A1 | 5/2002 | Kim et al. | 438/228 |
| 2002/0197790 | A1 | 12/2002 | Kizilyalli et al. | 438/240 |
| 2003/0032303 | A1 | 2/2003 | Yu et al. | 438/770 |
| 2003/0045080 | A1 | 3/2003 | Visokay et al. | 438/591 |

FOREIGN PATENT DOCUMENTS

GB    2 358 737 A    4/2001

OTHER PUBLICATIONS

Brask et al., "A CMOS Device With Metal and Silicide Gate Electrodes and a Method for Making It", U.S. Appl. No. 10/748,559, filed Dec. 29, 2003.

Doczy et al., "A Method for Making a Semiconductor Device that Includes a Metal Gate Electrode", U.S. Appl. No. 10/748,545, filed Dec. 29, 2003.

Polishchuk et al., "Dual Workfunction CMOS Gate Technology Based on Metal Interdiffusion", www.eesc.berkeley.edu, 1 page, (no date).

Doug Barlage et al., "High Frequency Response of 100nm Integrated CMOS Transistors with High-K Gate Dielectrics", 2001, IEEE, 4 pages.

Lu et al., "Dual-Metal Gate Technology for Deep-Submicron CMOS Devices", dated Apr. 29, 2003, 1 page.

Schwantes et al., "Performance Improvement of Metal Gate CMOS Technologies with Gigabit Feature Sizes", Technical University of Hanburg-Harburg, 5 pages, (no date).

Doczy et al., "Integrating N-type and P-type Metal Gate Transistors", U.S. Appl. No. 10/327,293, filed Dec. 20, 2002.

Brask et al., "A Method for Making a Semiconductor Device Having a High-K Gate Dielectric", U.S. Appl. No. 10/387,303, filed Mar. 11, 2003.

Brask et al., "A Method for Making a Semiconductor Device Having a High-K Gate Dielectric", U.S. Appl. No. 10/391,816, filed Mar. 18, 2003.

Chau et al., "A Method for Making a Semiconductor Device Having a Metal Gate Electrode", U.S. Appl. No. 10/431,166, filed May 6, 2003.

Brask et al., "A Selective Etch Process for Making a Semiconductor Device Having a High-K Gate Dielectric", U.S. Appl. No. 10/652,546, filed Aug. 28, 2003.

Brask et al., "A Method for Making a Semiconductor Device Having a High-K Gate Dielectric," U.S. Appl. No. 10/642,796, filed Aug. 28, 2003.

Brask, "Methods and Compositions for Selectively Etching Metal Films and Structures," U.S. Appl. No. 10/658,225, filed Sep. 8, 2003.

Brask et al., "A Method for Making a Semiconductor Device Having a Metal Gate Electrode," U.S. Appl. No. 10/704,497, filed Nov. 6, 2003.

Brask et al., "A Method for Etching a Thin Metal Layer", U.S. Appl. No. 10/704,498, filed Nov. 6, 2003.

\* cited by examiner

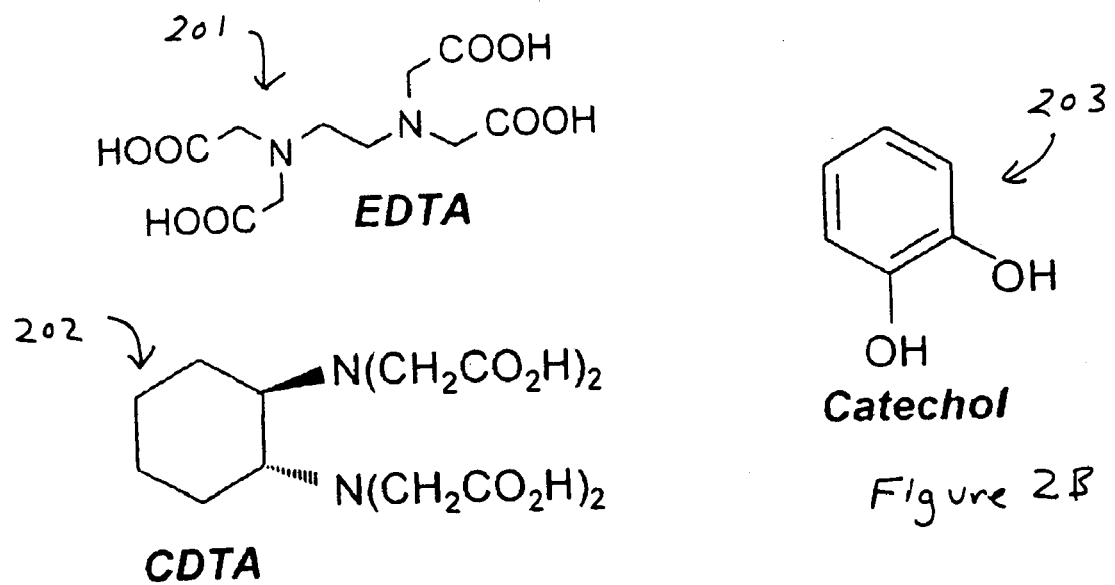
Figure 2A
Figure 2B
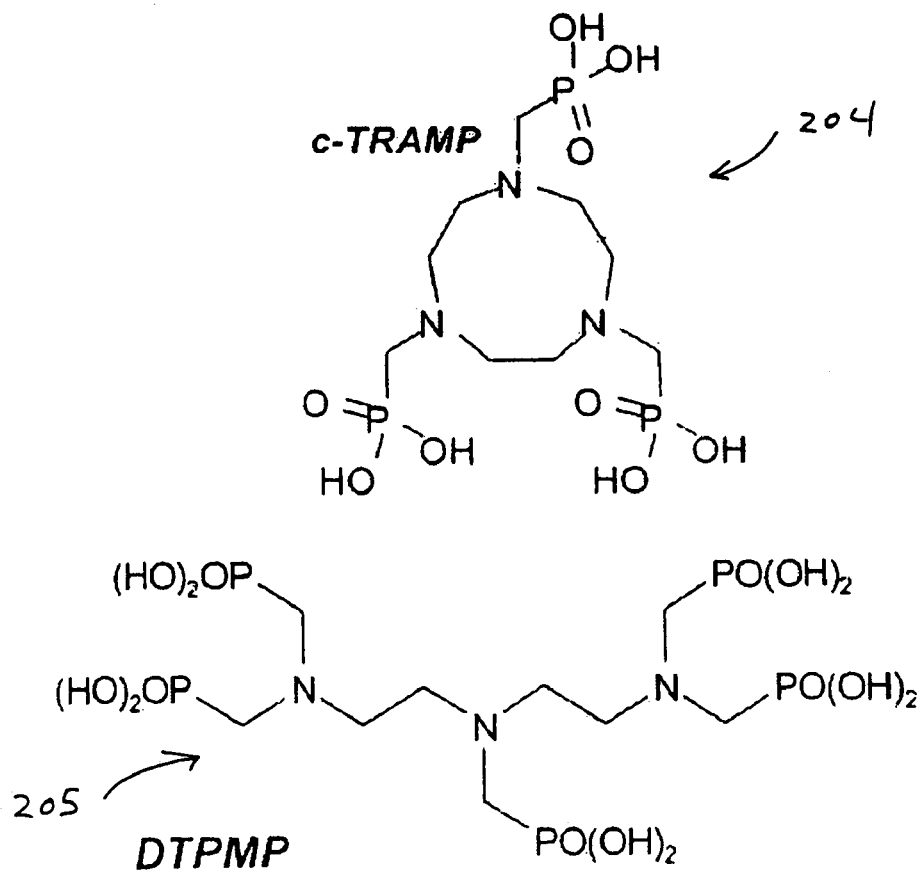
Figure 2C

METHOD FOR MAKING A SEMICONDUCTOR DEVICE WITH A METAL GATE ELECTRODE THAT IS FORMED ON AN ANNEALED HIGH-K GATE DIELECTRIC LAYER

FIELD OF THE INVENTION

The present invention relates to methods for making semiconductor devices, in particular, semiconductor devices with metal gate electrodes.

BACKGROUND OF THE INVENTION

MOS field-effect transistors with very thin gate dielectrics made from silicon dioxide may experience unacceptable gate leakage currents. Forming the gate dielectric from certain high-k dielectric materials, instead of silicon dioxide, can reduce gate leakage. When, however, a high-k dielectric film is initially formed, it may have a slightly imperfect molecular structure. To repair such a film, it may be necessary to anneal it at a relatively high temperature.

Because such a high-k dielectric layer may not be compatible with polysilicon, it may be desirable to use metal gate electrodes in devices that include high-k gate dielectrics. When making a CMOS device that includes metal gate electrodes, it may be necessary to make the NMOS and PMOS gate electrodes from different materials. A replacement gate process may be used to form gate electrodes from different metals. In that process, a first polysilicon layer, bracketed by a pair of spacers, is removed selectively to a second polysilicon layer to create a trench between the spacers. The trench is filled with a first metal. The second polysilicon layer is then removed, and replaced with a second metal that differs from the first metal.

If in such a replacement gate process a high-k dielectric layer is formed after a polysilicon layer is removed, it may not be possible to apply a high temperature anneal to the high-k dielectric layer. It may not be possible to apply such an anneal to such a layer if a silicide has been formed on the transistor's source and drain regions prior to polysilicon layer removal. In addition, such an anneal may not be feasible if a high temperature intolerant metal has been formed on a first high-k dielectric layer prior to depositing a second high-k dielectric layer. For example, if a high temperature intolerant metal has been deposited on a first high-k dielectric layer to form the gate electrode for an NMOS transistor, then a high temperature anneal cannot be applied to a subsequently deposited second high-k dielectric layer, which will form the gate dielectric for the PMOS transistor.

Accordingly, there is a need for an improved method for making a semiconductor device that includes metal gate electrodes. There is a need for such a process that enables a high temperature anneal to be applied to a high-k dielectric layer without damaging any silicide or high temperature intolerant metal that may be used to make the device's transistors. The present invention provides such a method.

BRIEF DESCRIPTION OF THE DRAWINGS

FIGS. 2A–2C identify hexa-dentate chelating agents that may be used in an embodiment of the method of the present invention.

Features shown in these figures are not intended to be drawn to scale.

DETAILED DESCRIPTION OF THE PRESENT INVENTION

A method for making a semiconductor device is described. That method comprises forming a high-k gate dielectric layer on a substrate, and forming a sacrificial layer on the high-k gate dielectric layer. After etching the sacrificial layer and the high-k gate dielectric layer to form a patterned sacrificial layer and a patterned high-k gate dielectric layer, first and second spacers are formed on opposite sides of the patterned sacrificial layer. The patterned sacrificial layer is then removed to expose the patterned high-k gate dielectric layer and to generate a trench that is positioned between the first and second spacers. A metal layer is then formed on the high-k gate dielectric layer.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
FIGS. 1A–1N represent cross-sections of structures that may be formed when carrying out an embodiment of the method of the present invention.
Figure 1B:
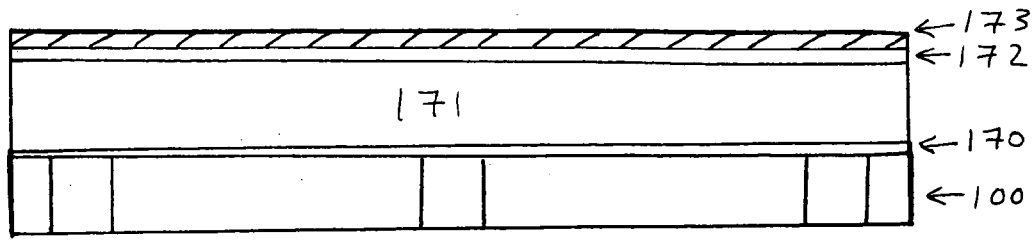
Figure 1C:
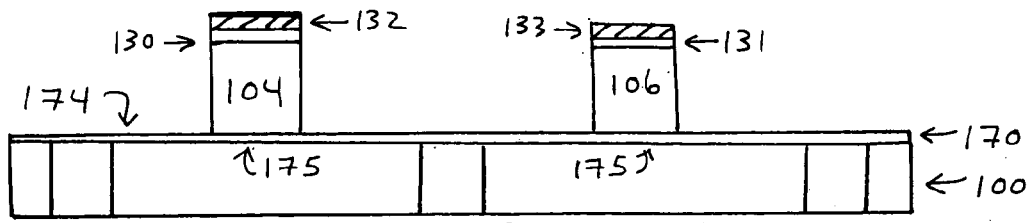
Figure 1D:
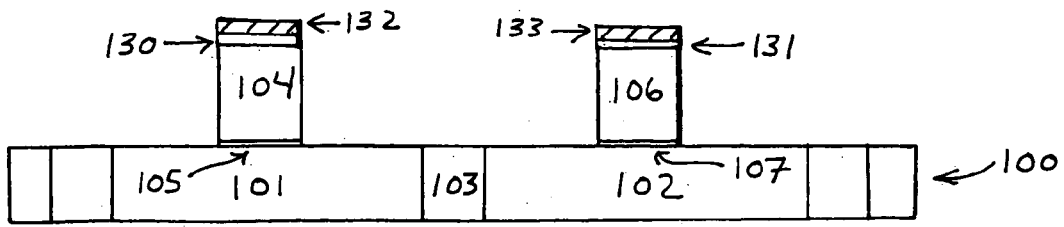
Figure 1E:
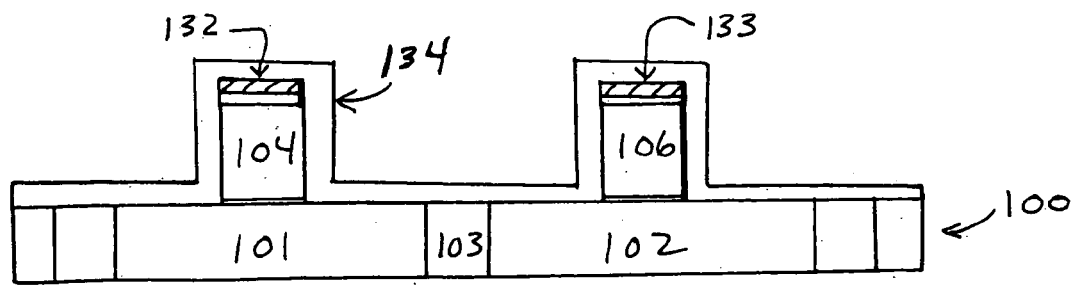
Figure 1F:
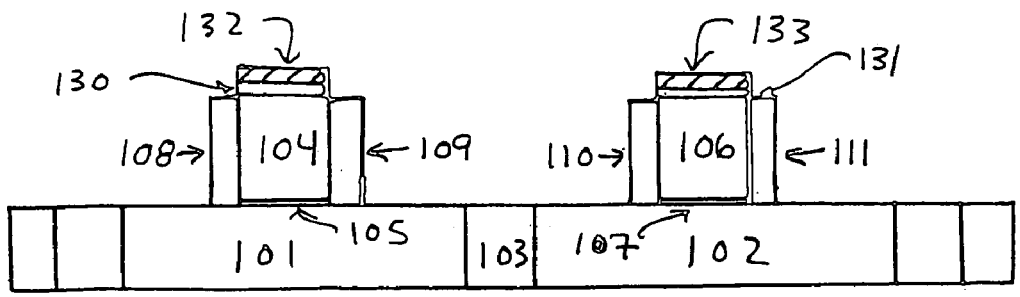
Figure 1G:
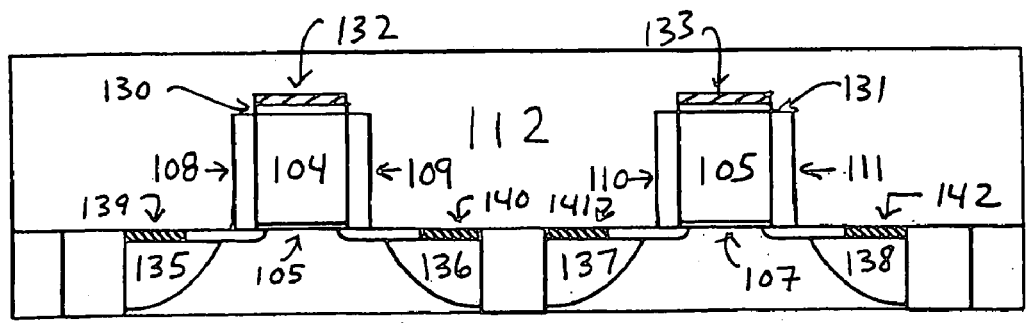
Figure 1H:
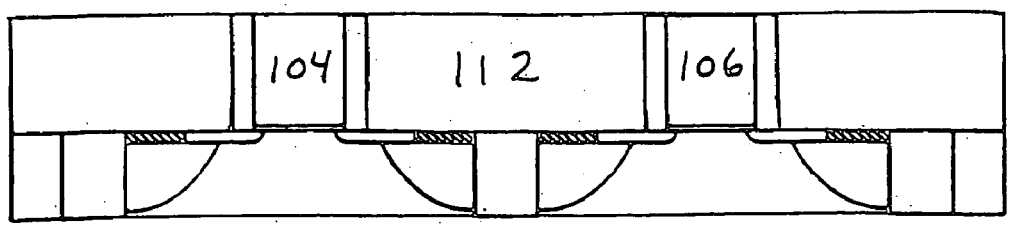
Figure 1I:
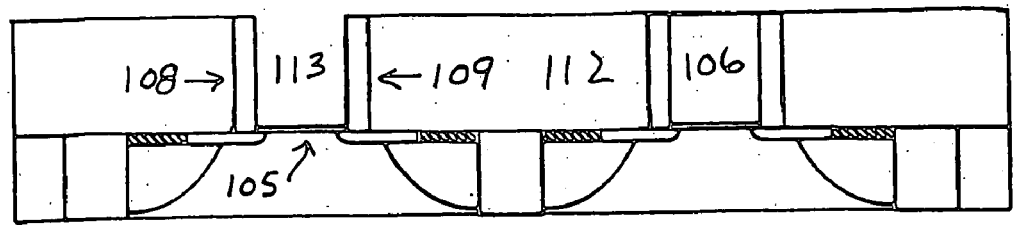
Figure 1J:
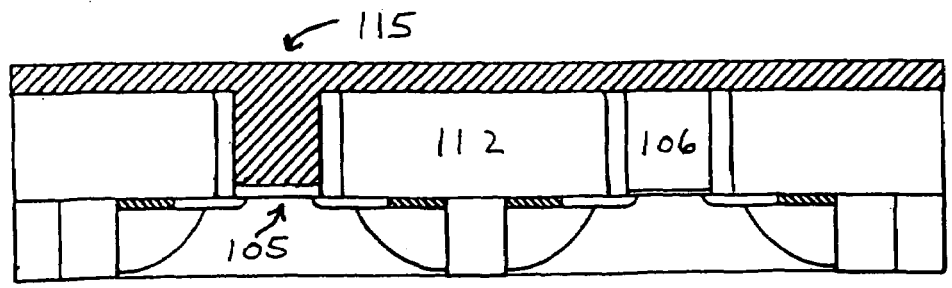
Figure 1K:
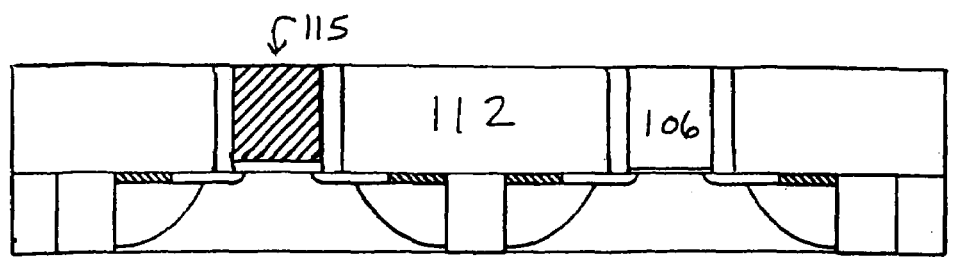
Figure 1L:
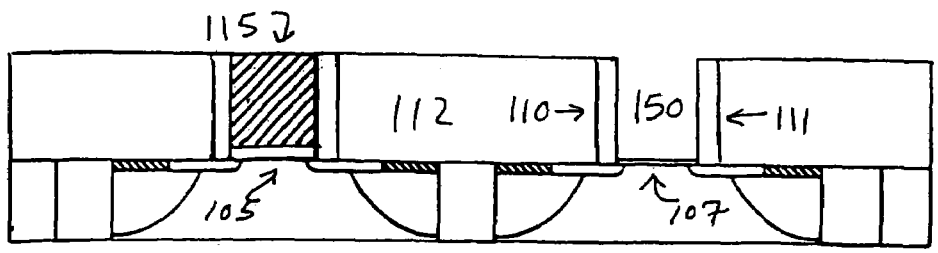
Figure 1M:
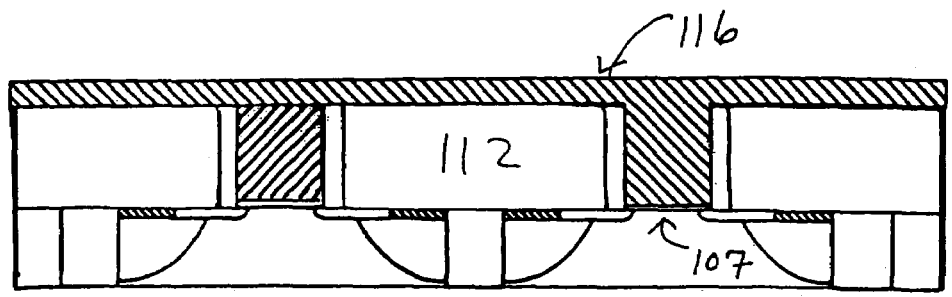
Figure 1N:
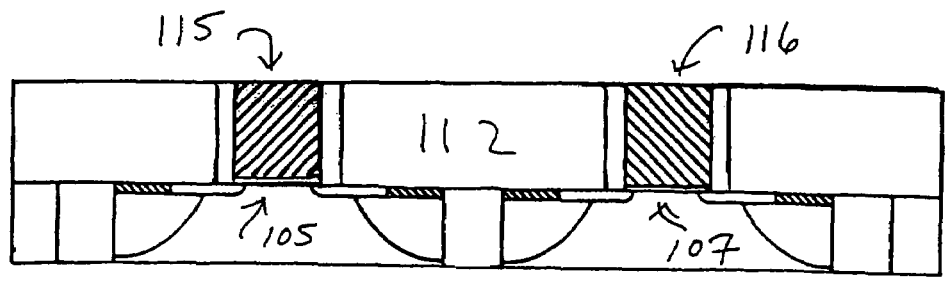

FIGS. 1A–1N illustrate structures that may be formed, when carrying out an embodiment of the method of the present invention. Initially, high-k gate dielectric layer 170 is formed on substrate 100, generating the FIG. 1A structure. Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 100 may be formed are described here, any material that may serve as a foundation upon which a semiconductor device may be built falls within the spirit and scope of the present invention.

Some of the materials that may be used to make high-k gate dielectric layer 170 include: hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, titanium oxide and aluminum oxide. Although a few examples of materials that may be used to form high-k gate dielectric layer 170 are described here, that layer may be made from other materials that serve to reduce gate leakage.

High-k gate dielectric layer 170 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and high-k gate dielectric layer 170. The CVD reactor should be operated long enough to form a layer with the desired thickness. In most applications, high-k gate dielectric layer 170 should be less than about 60 angstroms thick, and more preferably between about 5 angstroms and about 40 angstroms thick.

After high-k gate dielectric layer 170 is formed on substrate 100, sacrificial layer 171 is formed on high-k gate dielectric layer 170. In this embodiment, hard mask layer 172 is then formed on sacrificial layer 171, and etch stop layer 173 is formed on hard mask layer 172—generating the FIG. 1B structure. Sacrificial layer 171 may comprise polysilicon and may be deposited on high-k gate dielectric layer 170 using a conventional deposition process. Sacrificial layer 171 is preferably between about 100 and about 2,000 angstroms thick, and is more preferably between about 500 and about 1,600 angstroms thick.

Hard mask layer 172 may comprise silicon nitride, and is preferably between about 100 and about 500 angstroms thick—and is more preferably between about 200 and about 350 angstroms thick. Etch stop layer 173 may comprise a material that will be removed at a substantially slower rate than hard mask layer 172 will be removed when an appropriate etch process is applied. Etch stop layer 173 may, for example, be made from an oxide (e.g., silicon dioxide or a metal oxide such as hafnium dioxide), a carbide (e.g., silicon carbide or a metal carbide), a carbon doped silicon oxide, or a carbon doped silicon nitride. Etch stop layer 173 is preferably between about 200 and about 1,200 angstroms thick, and is more preferably between about 400 and about 600 angstroms thick. Hard mask layer 172 may be formed on sacrificial layer 171, and etch stop layer 173 may be formed on hard mask layer 172 using conventional deposition techniques.

Sacrificial layer 171, hard mask layer 172, and etch stop layer 173 are then patterned to form patterned etch stop layers 132, 133, patterned hard mask layers 130, 131, and patterned sacrificial layers 104, 106—as FIG. 1C illustrates. Conventional wet or dry etch processes may be used to remove unprotected parts of etch stop layer 173, hard mask layer 172, and sacrificial layer 171. In this embodiment, after those layers have been etched, exposed part 174 of high-k gate dielectric layer 170 is removed.

Although exposed part 174 of high-k gate dielectric layer 170 may be removed using dry or wet etch techniques, it may be difficult to etch that layer using such processes without adversely affecting adjacent structures. It may be difficult to etch high-k gate dielectric layer 170 selectively to the underlying substrate using a dry etch process, and wet etch techniques may etch high-k gate dielectric layer 170 isotropically—undercutting overlying sacrificial layers 104, 106 in an undesirable fashion.

To minimize the lateral removal of high-k gate dielectric layer 170, as exposed part 174 of that layer is etched, exposed part 174 of high-k gate dielectric layer 170 may be modified to facilitate its removal selectively to covered part 175 of that layer. Exposed part 174 may be modified by adding impurities to that part of high-k gate dielectric layer 170 after sacrificial layer 171 has been etched. A plasma enhanced chemical vapor deposition ("PECVD") process may be used to add impurities to exposed part 174 of high-k gate dielectric layer 170. In such a PECVD process, a halogen or halide gas (or a combination of such gases) may be fed into a reactor prior to striking a plasma. The reactor should be operated under the appropriate conditions (e.g., temperature, pressure, radio frequency, and power) for a sufficient time to modify exposed part 174 to ensure that it may be removed selectively to other materials. In a preferred embodiment, a low power PECVD process, e.g., one taking place at less than about 200 watts, is used.

In a particularly preferred embodiment, hydrogen bromide ("HBr") and chlorine ("$Cl_2$") gases are fed into the reactor at appropriate flow rates to ensure that a plasma generated from those gases will modify exposed part 174 in the desired manner. Between about 50 and about 100 watts wafer bias (preferably about 100 watts) may be applied for a sufficient time to complete the desired transformation of exposed part 174. Plasma exposure lasting less than about one minute, and perhaps as short as 5 seconds, may be adequate to cause that conversion.

After exposed part 174 has been modified, it may be removed. The presence of the added impurities enables that exposed part to be etched selectively to covered part 175 to generate the FIG. 1D structure. In a preferred embodiment, exposed part 174 is removed by exposing it to a relatively strong acid, e.g., a halide based acid (such as hydrobromic or hydrochloric acid) or phosphoric acid. When a halide based acid is used, the acid preferably contains between about 0.5% and about 10% HBr or HCl by volume—and more preferably about 5% by volume. An etch process that uses such an acid may take place at or near room temperature, and last for between about 5 and about 30 minutes—although a longer exposure may be used if desired. When phosphoric acid is used, the acid preferably contains between about 75% and about 95% $H_3PO_4$ by volume. An etch process that uses such an acid preferably takes place at between about 140° C. and about 180° C., and more preferably at about 160° C. When such an acid is used, the exposure step should last between about 30 seconds and about 5 minutes—and preferably for about one minute for a 20 angstrom thick film.

As an alternative to adding impurities to exposed part 174 to modify that portion of high-k gate dielectric layer 170 prior to removing it, exposed part 174 may be modified by subjecting it to a reducing agent. When high-k gate dielectric layer 170 comprises a metal oxide layer, such a treatment may convert exposed part 174 of that metal oxide layer into a metal layer. Such a metal layer may then be removed selectively to covered part 175 of high-k gate dielectric layer 170, minimizing undercut of sacrificial layers 104, 106. In one embodiment, a wet etch process that employs a chelating agent (e.g., an organic compound that may bind to a metal ion to form a chelate) may be used to remove the metal layer, which results from uncovered part 174's exposure to a reducing agent. Examples of potentially useful chelating agents include those that have been employed to remove metallic contaminants from semiconductor substrates.

FIGS. 2A–2C identify some hexa-dentate chelating agents (i.e., chelating agents with six bonding atoms) that may be used. These include: carboxylic acid based chelating agents 201 and 202 (EDTA and CDTA, respectively); catechol 203 (representative of phenol derivatives that may be used); and phosphonic acid based chelating agents 204 and 205 (c-TRAMP and DTPMP). When such well known chelating agents are added to an aqueous solution to etch exposed part 174, they may be included at a concentration of between about 0.5 and about 5.0 moles/liter. The device should be exposed to such a solution for a sufficient amount of time to remove substantially all of exposed part 174.

Depending upon the composition of exposed part 174 and covered part 175, it may be desirable to modify the chelating agents described above (or to employ other types of chelating agents) to ensure that exposed part 174 is etched selectively to covered part 175. A chelating agent that is tailored to bind with ions of a specific metal may selectively etch a layer that includes that metal without significantly etching an adjacent film having a different composition. In this respect, parts of a chelating agent, e.g., aryl or alkyl groups, may be modified to enhance its ability to bind to a specific metal (or metals) to enable selective etching of that metal.

The chelating agent selected for the wet etch chemistry used to etch exposed part 174 should be combined with a suitable solvent to maximize etch selectively. The best solvent for etching exposed part 174 selectively to covered part 175 may be de-ionized water. In other embodiments, the optimum solvent may be acidic or basic, and may comprise many types of polar and/or nonpolar components, depending upon the composition of exposed part 174 and covered part 175.

In a preferred embodiment, applying a wet etch chemistry that includes a chelating agent to etch exposed part 174 ensures that less than about 100 angstroms of covered part 175 will be removed from beneath sacrificial layers 104, 106. In an even more preferred embodiment, such an etch process will undercut sacrificial layers 104, 106 by less than about 50 angstroms. Using a chelating agent to etch exposed part 174 may provide another benefit. Forming chelates that include extracted metal ions causes those ions to be held in solution—preventing, or at least substantially reducing, metal redeposition.

FIG. 1D represents an intermediate structure that may be formed when making a complementary metal oxide semiconductor ("CMOS"). That structure includes first part 101 and second part 102 of substrate 100. Isolation region 103 separates first part 101 from second part 102. Isolation region 103 may comprise silicon dioxide, or other materials that may separate the transistor's active regions. First sacrificial layer 104 is formed on first high-k gate dielectric layer 105, and second sacrificial layer 106 is formed on second high-k gate dielectric layer 107. Hard masks 130, 131 are formed on sacrificial layers 104, 106, and etch stop layers 132, 133 are formed on hard masks 130, 131.

After forming the FIG. 1D structure, spacers are formed on opposite sides of sacrificial layers 104, 106. When those spacers comprise silicon nitride, they may be formed in the following way. First, a silicon nitride layer of substantially uniform thickness—preferably less than about 1000 angstroms thick—is deposited over the entire structure, producing the structure shown in FIG. 1E. Conventional deposition processes may be used to generate that structure.

In a preferred embodiment, silicon nitride layer 134 is deposited directly on substrate 100, patterned etch stop layers 132, 133, and opposite sides of sacrificial layers 104, 106—without first forming a buffer oxide layer on substrate 100 and layers 104, 106. In alternative embodiments, however, such a buffer oxide layer may be formed prior to forming layer 134. Similarly, although not shown in FIG. 1E, a second oxide may be formed on layer 134 prior to etching that layer. If used, such an oxide may enable the subsequent silicon nitride etch step to generate an L-shaped spacer.

Silicon nitride layer 134 may be etched using a conventional process for anisotropically etching silicon nitride to create the FIG. 1F structure. Etch stop layers 132, 133 prevent such an anisotropic etch step from removing hard masks 130, 131, when silicon nitride layer 134 is etched—even when hard masks 130, 131 comprise silicon nitride. As a result of that etch step, sacrificial layer 104 is bracketed by a pair of sidewall spacers 108, 109, and sacrificial layer 106 is bracketed by a pair of sidewall spacers 110, 111.

As is typically done, it may be desirable to perform multiple masking and ion implantation steps to create lightly implanted regions near layers 104, 106 (that will ultimately serve as tip regions for the device's source and drain regions), prior to forming spacers 108, 109, 110, 111 on sacrificial layers 104, 106. Also as is typically done, the source and drain regions may be formed, after forming spacers 108, 109, 110, 111, by implanting ions into parts 101 and 102 of substrate 100, followed by applying an appropriate anneal step.

When sacrificial layers 104, 106 comprise polysilicon, an ion implantation and anneal sequence used to form n-type source and drain regions within part 101 of substrate 100 may dope polysilicon layer 104 n-type at the same time. Similarly, an ion implantation and anneal sequence used to form p-type source and drain regions within part 102 of substrate 100 may dope polysilicon layer 106 p-type. When doping polysilicon layer 106 with boron, that layer should include that element at a sufficient concentration to ensure that a subsequent wet etch process, for removing n-type polysilicon layer 104, will not remove a significant amount of p-type polysilicon layer 106.

The anneal will activate the dopants that were previously introduced into the source and drain regions and into sacrificial layers 104, 106. In a preferred embodiment, a rapid thermal anneal is applied that takes place at a temperature that exceeds about 1,000° C.—and, optimally, that takes place at 1,080° C. In addition to activating the dopants, such an anneal may modify the molecular structure of high-k gate dielectric layers 105, 107 to create gate dielectric layers that may demonstrate improved performance.

After forming spacers 108, 109, 110, 111, dielectric layer 112 may be deposited over the device, generating the FIG. 1G structure. Dielectric layer 112 may comprise silicon dioxide, or a low-k material. Dielectric layer 112 may be doped with phosphorus, boron, or other elements, and may be formed using a high density plasma deposition process. By this stage of the process, source and drain regions 135, 136, 137, 138, which are capped by silicided regions 139, 140, 141, 142, have already been formed. Those source and drain regions may be formed by implanting ions into the substrate, then activating them. Alternatively, an epitaxial growth process may be used to form the source and drain regions, as will be apparent to those skilled in the art.

Forming sacrificial layers 104, 106 from polysilicon may enable one to apply commonly used nitride spacer, source/drain, and suicide formation techniques to make the FIG. 1G structure. That structure may include other features—not shown, so as not to obscure the method of the present invention—that may be formed using conventional process steps.

Dielectric layer 112 is removed from patterned etch stop layers 132, 133, which are, in turn, removed from hard masks 130, 131, which are, in turn, removed from patterned sacrificial layers 104, 106, producing the FIG. 1H structure. A conventional chemical mechanical polishing ("CMP") operation may be applied to remove that part of dielectric layer 112, patterned etch stop layers 132, 133, and hard masks 130, 131. Etch stop layers 132, 133 and hard masks 130, 131 must be removed to expose patterned sacrificial layers 104, 106. Etch stop layers 132, 133 and hard masks 130, 131 may be polished from the surface of layers 104, 106, when dielectric layer 112 is polished—as they will have served their purpose by that stage in the process.

After forming the FIG. 1H structure, sacrificial layer 104 is removed to generate trench 113 that is positioned between sidewall spacers 108, 109—producing the structure shown in FIG. 1I. In a preferred embodiment, a wet etch process that is selective for layer 104 over sacrificial layer 106 is applied to remove layer 104 without removing significant portions of layer 106.

When sacrificial layer 104 is doped n-type, and sacrificial layer 106 is doped p-type (e.g., with boron), such a wet etch process may comprise exposing sacrificial layer 104 to an aqueous solution that comprises a source of hydroxide for a sufficient time at a sufficient temperature to remove substantially all of layer 104. That source of hydroxide may comprise between about 2 and about 30 percent ammonium hydroxide or a tetraalkyl ammonium hydroxide, e.g., tetramethyl ammonium hydroxide ("TMAH"), by volume in deionized water.

Sacrificial layer 104 may be selectively removed by exposing it to a solution, which is maintained at a temperature between about 15° C. and about 90° C. (and preferably below about 40° C.), that comprises between about 2 and about 30 percent ammonium hydroxide by volume in deionized water. During that exposure step, which preferably lasts at least one minute, it may be desirable to apply sonic energy at a frequency of between about 10 KHz and about 2,000 KHz, while dissipating at between about 1 and about 10 watts/cm$^2$.

In a particularly preferred embodiment, sacrificial layer 104, with a thickness of about 1,350 angstroms, may be selectively removed by exposing it at about 25° C. for about 30 minutes to a solution that comprises about 15 percent ammonium hydroxide by volume in deionized water, while applying sonic energy at about 1,000 KHz—dissipating at about 5 watts/cm$^2$. Such an etch process should remove substantially all of an n-type polysilicon layer without removing a meaningful amount of a p-type polysilicon layer.

As an alternative, sacrificial layer 104 may be selectively removed by exposing it for at least one minute to a solution, which is maintained at a temperature between about 60° C. and about 90° C., that comprises between about 20 and about 30 percent TMAH by volume in deionized water, while applying sonic energy. Removing sacrificial layer 104, with a thickness of about 1,350 angstroms, by exposing it at about 80° C. for about 2 minutes to a solution that comprises about 25 percent TMAH by volume in deionized water, while applying sonic energy at about 1,000 KHz—dissipating at about 5 watts/cm$^2$—may remove substantially all of layer 104 without removing a significant amount of layer 106. First high-k gate dielectric layer 105 should be sufficiently thick to prevent the etchant that is applied to remove sacrificial layer 104 from reaching the channel region that is located beneath first high-k gate dielectric layer 105.

When sacrificial layer 104 comprises polysilicon, metal included in first high-k gate dielectric layer 105 may interact with the polysilicon. After sacrificial layer 104 is removed, it may be desirable to clean first high-k gate dielectric layer 105 to prevent any such interaction from significantly altering the properties of first high-k gate dielectric layer 105. A wet chemical treatment may be applied to first high-k gate dielectric layer 105 to clean that layer. Such a wet chemical treatment may comprise exposing first high-k gate dielectric layer 105 to a solution that comprises hydrogen peroxide. The appropriate time and temperature at which first high-k gate dielectric layer 105 is exposed may depend upon the desired properties for first high-k gate dielectric layer 105.

When first high-k gate dielectric layer 105 is exposed to a hydrogen peroxide based solution, an aqueous solution that contains between about 2% and about 30% hydrogen peroxide by volume may be used. That exposure step should take place at between about 15° C. and about 40° C. for at least about one minute. In a particularly preferred embodiment, first high-k gate dielectric layer 105 is exposed to an aqueous solution that contains about 6.7% $H_2O_2$ by volume for about 10 minutes at a temperature of about 25° C. During that exposure step, it may be desirable to apply sonic energy at a frequency of between about 10 KHz and about 2,000 KHz, while dissipating at between about 1 and about 10 watts/cm$^2$. In a preferred embodiment, sonic energy may be applied at a frequency of about 1,000 KHz, while dissipating at about 5 watts/cm$^2$.

Although not shown in FIG. 1I, it may be desirable to form a capping layer, which is no more than about five monolayers thick, on first high-k gate dielectric layer 105. Such a capping layer may be formed by sputtering one to five monolayers of silicon, or another material, onto the surface of first high-k gate dielectric layer 105. The capping layer may then be oxidized, e.g., by using a plasma enhanced chemical vapor deposition process or a solution that contains an oxidizing agent, to form a capping dielectric oxide.

Although in some embodiments it may be desirable to form a capping layer on gate dielectric layer 105, in the illustrated embodiment, n-type metal layer 115 is formed directly on layer 105 to fill trench 113 and to generate the FIG. 1J structure. N-type metal layer 115 may comprise any n-type conductive material from which a metal NMOS gate electrode may be derived. N-type metal layer 115 preferably has thermal stability characteristics that render it suitable for making a metal NMOS gate electrode for a semiconductor device.

Materials that may be used to form n-type metal layer 115 include: hafnium, zirconium, titanium, tantalum, aluminum, and their alloys, e.g., metal carbides that include these elements, i.e., hafnium carbide, zirconium carbide, titanium carbide, tantalum carbide, and aluminum carbide. N-type metal layer 115 may be formed on first high-k gate dielectric layer 105 using well known PVD or CVD processes, e.g., conventional sputter or atomic layer CVD processes. As shown in FIG. 1K, n-type metal layer 115 is removed except where it fills trench 113. Layer 115 may be removed from other portions of the device via a wet or dry etch process, or an appropriate CMP operation. Dielectric 112 may serve as an etch or polish stop, when layer 115 is removed from its surface.

N-type metal layer 115 preferably serves as a metal NMOS gate electrode that has a workfunction that is between about 3.9 eV and about 4.2 eV, and that is between about 100 angstroms and about 2,000 angstroms thick, and more preferably is between about 500 angstroms and about 1,600 angstroms thick. Although FIGS. 1J and 1K represent structures in which n-type metal layer 115 fills all of trench 113, in alternative embodiments, n-type metal layer 115 may fill only part of trench 113, with the remainder of the trench being filled with a material that may be easily polished, e.g., tungsten, aluminum, titanium, or titanium nitride. In such an alternative embodiment, n-type metal layer 115, which serves as the workfunction metal, may be between about 50 and about 1,000 angstroms thick—and more preferably at least about 100 angstroms thick.

In embodiments in which trench 113 includes both a workfunction metal and a trench fill metal, the resulting metal NMOS gate electrode may be considered to comprise the combination of both the workfunction metal and the trench fill metal. If a trench fill metal is deposited on a workfunction metal, the trench fill metal may cover the entire device when deposited, forming a structure like the FIG. 1J structure. That trench fill metal must then be polished back so that it fills only the trench, generating a structure like the FIG. 1K structure.

In the illustrated embodiment, after forming n-type metal layer 115 within trench 113, sacrificial layer 106 is removed to generate trench 150 that is positioned between sidewall spacers 110, 111—producing the structure shown in FIG. 1L. In a preferred embodiment, layer 106 is exposed to a solution that comprises between about 20 and about 30 percent TMAH by volume in deionized water for a sufficient time at a sufficient temperature (e.g., between about 60° C. and about 90° C.), while applying sonic energy, to remove all of layer 106 without removing significant portions of n-type metal layer 115.

Alternatively, a dry etch process may be applied to selectively remove layer 106. When sacrificial layer 106 is doped p-type (e.g., with boron), such a dry etch process may comprise exposing sacrificial layer 106 to a plasma derived from sulfur hexafluoride ("$SF_6$"), hydrogen bromide ("HBr"), hydrogen iodide ("HI"), chlorine, argon, and/or helium. Such a selective dry etch process may take place in a parallel plate reactor or in an electron cyclotron resonance etcher.

After removing sacrificial layer 106, it may be desirable to clean second high-k gate dielectric layer 107, e.g., by exposing that layer to the hydrogen peroxide based solution described above. Optionally, as mentioned above, a capping layer (which may be oxidized after it is deposited) may be formed on second high-k gate dielectric layer 107 prior to filling trench 150 with a p-type metal. In this embodiment, however, p-type metal layer 116 is formed directly on layer 107 to fill trench 150 and to generate the FIG. 1M structure. P-type metal layer 116 may comprise any p-type conductive material from which a metal PMOS gate electrode may be derived. P-type metal layer 116 preferably has thermal stability characteristics that render it suitable for making a metal PMOS gate electrode for a semiconductor device.

Materials that may be used to form p-type metal layer 116 include: ruthenium, palladium, platinum, cobalt, nickel, and conductive metal oxides, e.g., ruthenium oxide. P-type metal layer 116 may be formed on second high-k gate dielectric layer 107 using well known PVD or CVD processes, e.g., conventional sputter or atomic layer CVD processes. As shown in FIG. 1N, p-type metal layer 116 is removed except where it fills trench 150. Layer 116 may be removed from other portions of the device via a wet or dry etch process, or an appropriate CMP operation, with dielectric 112 serving as an etch or polish stop.

P-type metal layer 116 may serve as a metal PMOS gate electrode with a workfunction that is between about 4.9 eV and about 5.2 eV, and that is between about 100 angstroms and about 2,000 angstroms thick, and more preferably is between about 500 angstroms and about 1,600 angstroms thick. Although FIGS. 1M and 1N represent structures in which p-type metal layer 116 fills all of trench 150, in alternative embodiments, p-type metal layer 116 may fill only part of trench 150. As with the metal NMOS gate electrode, the remainder of the trench may be filled with a material that may be easily polished, e.g., tungsten, aluminum, titanium, or titanium nitride. In such an alternative embodiment, p-type metal layer 116, which serves as the workfunction metal, may be between about 50 and about 1,000 angstroms thick. Like the metal NMOS gate electrode, in embodiments in which trench 150 includes a workfunction metal and a trench fill metal, the resulting metal PMOS gate electrode may be considered to comprise the combination of both the workfunction metal and the trench fill metal.

After removing metal layer 116, except where it fills trench 150, a capping dielectric layer may be deposited onto dielectric layer 112, metal NMOS gate electrode 115, and metal PMOS gate electrode 116, using any conventional deposition process. Process steps for completing the device that follow the deposition of such a capping dielectric layer, e.g., forming the device's contacts, metal interconnect, and passivation layer, are well known to those skilled in the art and will not be described here.

Although the embodiment described above anneals high-k gate dielectric layers 105, 107 when dopants—previously implanted into sacrificial layers 104, 106 and into the source and drain regions—are activated, the high-k gate dielectric layer (or layers) may be annealed at a different stage in the process. For example, a high temperature anneal may be applied to high-k gate dielectric layer 170 immediately after that layer has been deposited on substrate 100, or such an anneal may be applied immediately after high-k gate dielectric layer 170 has been etched to form high-k gate dielectric layers 105, 107. The temperature at which such an anneal takes place should exceed about 700° C.

Forming high-k gate dielectric layers 105, 107 prior to removing sacrificial layers 104, 106 enables a high temperature anneal to be applied to those dielectric layers prior to forming silicided regions, and prior to forming metal layers on high-k gate dielectric layers 105, 107. Forming high-k gate dielectric layers 105, 107 at a relatively early stage in the process is advantageous for another reason. When an atomic layer CVD process is applied to generate high-k gate dielectric layers at the bottom of trenches 113, 150—after sacrificial layers 104, 106 are removed, the high-k dielectric material may be deposited on both the sides and bottoms of the trenches. Additional process steps may be required to prevent the high-k dielectric material's presence on the sides of the trenches from adversely affecting device characteristics—complicating the overall process. Forming high-k gate dielectric layers 105, 107 prior to removing sacrificial layers 104, 106, ensures that the high-k dielectric material will form on the trench bottoms only, and not on the sides of the trenches.

The method described above enables production of CMOS devices that include high-k gate dielectric layers, which have been subjected to a high temperature anneal. This method enables such an anneal to be applied to such a dielectric layer without damaging any silicide or high temperature intolerant metal that may be used to make the device's transistors.

Although the foregoing description has specified certain steps and materials that may be used in the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:
    forming a high-k gate dielectric layer on a substrate;
    forming a sacrificial layer on the high-k gate dielectric layer;
    etching the sacrificial layer and the high-k gate dielectric layer to form a patterned sacrificial layer and a patterned high-k gate dielectric layer;
    forming first and second spacers on opposite sides of the patterned sacrificial layer;
    removing the patterned sacrificial layer to expose the patterned high-k gate dielectric layer and to generate a trench that is positioned between the first and second spacers;
    exposing the patterned high-k gate dielectric layer to a temperature that exceeds about 1000° C.; and
    forming a metal layer on the high-k gate dielectric layer.

2. The method of claim 1 wherein the high-k gate dielectric layer is between about 5 and about 40 angstroms thick and the sacrificial layer is between about 100 and about 2,000 angstroms thick and comprises polysilicon.

3. The method of claim 2 further comprising exposing the high-k gate dielectric layer to a temperature that exceeds about 700° C. prior to forming the metal layer on the high-k gate dielectric layer.

4. The method of claim 3 further comprising implanting ions into the patterned sacrificial layer.

5. The method of claim 4 wherein:
the high-k gate dielectric layer comprises a material that is selected from the group consisting of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate; and
the metal layer fills the entire trench and comprises a material that is selected from the group consisting of hafnium, zirconium, titanium, tantalum, aluminum, a metal carbide, ruthenium, palladium, platinum, cobalt, nickel, and a conductive metal oxide.

6. The method of claim 5 wherein the metal layer comprises a material that is selected from the group consisting of hafnium, zirconium, titanium, tantalum, aluminum, and a metal carbide, and has a workfunction that is between about 3.9 eV and about 4.2 eV.

7. The method of claim 5 wherein the metal layer comprises a material that is selected from the group consisting of ruthenium, palladium, platinum, cobalt, nickel, and a conductive metal oxide, and has a workfunction that is between about 4.9 eV and about 5.2 eV.

8. The method of claim 1 further comprising:
forming a first silicon nitride layer on the sacrificial layer;
forming an etch stop layer on the first silicon nitride layer;
etching the etch stop layer and the first silicon nitride layer, then etching the sacrificial layer and the high-k gate dielectric layer, to form a patterned etch stop layer and a patterned first silicon nitride layer on the patterned sacrificial layer;
depositing a second silicon nitride layer on the substrate, the patterned etch stop layer, and on opposite sides of the patterned sacrificial layer;
removing the second silicon nitride layer from part of the substrate and from the patterned etch stop layer to form the first and second spacers on opposite sides of the patterned sacrificial layer;
forming source and drain regions next to the first and second spacers;
forming a second dielectric layer on the patterned etch stop layer and on the substrate;
removing the second dielectric layer from the patterned etch stop layer;
removing the patterned etch stop layer from the patterned first silicon nitride layer;
removing the patterned first silicon nitride layer from the patterned sacrificial layer; then
removing the patterned sacrificial layer to expose the high-k gate dielectric layer and to generate the trench that is positioned between the first and second spacers, and
filling the entire trench with the metal layer that is formed on the high-k gate dielectric layer.

9. The method of claim 7 wherein the etch stop layer comprises a material that is selected from the group consisting of silicon dioxide, a metal oxide, silicon carbide, a metal carbide, a carbon doped silicon oxide, and a carbon doped silicon nitride.

10. A method for making a semiconductor device comprising:
forming on a substrate a high-k gate dielectric layer that is between about 5 and about 40 angstroms thick;
forming on the high-k gate dielectric layer a polysilicon containing layer that is between about 100 and about 2,000 angstroms thick;
etching the polysilicon containing layer and the high-k gate dielectric layer to form a patterned polysilicon containing layer, and a patterned high-k gate dielectric layer;
depositing a silicon nitride layer on the substrate and on the patterned polysilicon containing layer;
removing the silicon nitride layer from pad of the substrate to form first and second spacers on opposite sides of the patterned polysilicon containing layer;
implanting ions into the patterned polysilicon containing layer and into the substrate next to the first and second spacers; then
applying an anneal treatment at a sufficient temperature for a sufficient time to activate the implanted ions;
removing the patterned polysilicon containing layer to expose the high-k gate dielectric layer and to generate a trench that is positioned between the first and second spacers; and
filling at least part of the trench by forming a metal layer on the high-k gate dielectric layer.

11. The method of claim 10 further comprising:
forming a hard mask layer that is between about 100 and about 500 angstroms thick on the polysilicon containing layer;
forming an etch stop layer that is between about 200 and about 1,200 angstroms thick on the hard mask layer;
etching the etch stop layer and the hard mask layer, then etching the polysilicon containing layer and the high-k gate dielectric layer, to form a patterned etch stop layer and a patterned hard mask layer on the patterned polysilicon containing layer;
forming a second dielectric layer on the patterned etch stop layer and on the substrate;
removing the second dielectric layer from the patterned etch stop layer; and
removing the patterned etch stop layer and the patterned hard mask layer prior to removing the patterned polysilicon containing layer to expose the high-k gate dielectric layer and to generate the trench.

12. The method of claim 11 wherein:
the etch stop layer comprises a material that is selected from the group consisting of silicon dioxide, a metal oxide, silicon carbide, a metal carbide, a carbon doped silicon oxide, and a carbon doped silicon nitride;
the high-k gate dielectric layer comprises a material that is selected from the group consisting of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate; and
the metal layer fills the entire trench and comprises a material that is selected from the group consisting of hafnium, zirconium, titanium, tantalum, aluminum, a metal carbide, ruthenium, palladium, platinum, cobalt, nickel, and a conductive metal oxide.

13. The method of claim 10 wherein the metal layer comprises a material that is selected from the group consisting of hafnium, zirconium, titanium, tantalum, aluminum, and a metal carbide, and has a workfunction that is between about 3.9 eV and about 4.2 eV.

14. The method of claim 10 wherein the metal layer comprises a material that is selected from the group consisting of ruthenium, palladium, platinum, cobalt, nickel, and a conductive metal oxide, and has a workfunction that is between about 4.9 eV and about 5.2 eV.

15. The method of claim 11 wherein:
a chemical mechanical polishing process is used to remove the second dielectric layer from the patterned etch stop layer, and to remove the patterned etch stop layer and the patterned hard mask layer; and
the metal layer serves as a workfunction metal that fills only part of the trench and is between about 50 and about 1,000 angstroms thick; and
further comprising depositing on the metal layer a trench fill metal that is selected from the group consisting of tungsten, aluminum, titanium, and titanium nitride.

16. A method for making a semiconductor device comprising:
forming on a substrate a high-k gate dielectric layer that is between about 15 and about 40 angstroms thick, and that comprises a material selected from the group consisting of hafnium oxide, zirconium oxide, titanium oxide, and aluminum oxide,;
forming on the high-k gate dielectric layer a polysilicon containing layer that is between about 100 and about 2,000 angstroms thick;
forming a first silicon nitride layer that is between about 100 and about 500 angstroms thick on the polysilicon containing layer;
forming an etch stop layer that is between about 200 and about 1,200 angstroms thick on the first silicon nitride layer;
etching the etch stop layer, the first silicon nitride layer, the polysilicon containing layer, and the high-k gate dielectric layer, to form a patterned etch stop layer, a patterned first silicon nitride layer, a patterned polysilicon containing layer, and a patterned high-k gate dielectric layer;
depositing a second silicon nitride layer on the substrate, the patterned etch stop layer and/on opposite sides of the patterned polysilicon containing layer;
removing the second silicon nitride layer from part of the substrate and from the patterned etch stop layer to form first and second spacers on opposite sides of the patterned polysilicon containing layer;
implanting ions into the substrate next to the first and second spacers, and into the sacrificial layer;
applying a rapid thermal anneal at a temperature that exceeds about 1,000° C.;
forming a second dielectric layer on the patterned etch stop layer and on the substrate;
removing the second dielectric layer from the patterned etch stop layer;
removing the patterned etch stop layer and the patterned first silicon nitride layer;
removing the patterned polysilicon containing layer to expose the patterned high-k gate dielectric layer and to generate the trench that is positioned between the first and second spacers; and
filling at least part of the trench with a metal layer that is formed on the high-k gate dielectric layer.

17. The method of claim 16 wherein:
the etch stop layer comprises a material that is selected from the group consisting of silicon dioxide, a metal oxide, silicon carbide, a metal carbide, a carbon doped silicon oxide, and a carbon doped silicon nitride;
the high-k gate dielectric layer is formed by atomic layer chemical vapor deposition and comprises a material that is selected from the group consisting of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate; and
the metal layer fills the entire trench and comprises a material that is selected from the group consisting of hafnium, zirconium, titanium, tantalum, aluminum, a metal carbide, ruthenium, palladium, platinum, cobalt, nickel, and a conductive metal oxide.

18. The method of claim 16 wherein the metal layer comprises a material that is selected from the group consisting of hafnium, zirconium, titanium, tantalum, aluminum, and a metal carbide, and has a workfunction that is between about 3.9 eV and about 4.2 eV.

19. The method of claim 16 wherein the metal layer comprises a material that is selected from the group consisting of ruthenium, palladium, platinum, cobalt, nickel, and a conductive metal oxide, and has a workfunction that is between about 4.9 eV and about 5.2 eV.

20. The method of claim 16 wherein:
a chemical mechanical polishing process is used to remove the dielectric layer from the patterned etch stop layer, and to remove the patterned etch stop layer and the patterned first silicon nitride layer; and
the metal layer serves as a workfunction metal that fills only part of the trench and is between about 50 and about 1,000 angstroms thick; and
further comprising depositing on the metal layer a trench fill metal that is selected from the group consisting of tungsten, aluminum, titanium, and titanium nitride.

* * * * *